United States Patent [19]

Holmes

[11] Patent Number: 4,625,197

[45] Date of Patent: Nov. 25, 1986

[54] LOGARITHMIC ANALOG TO DIGITAL CONVERTER

[75] Inventor: Robert B. Holmes, Fairport, N.Y.

[73] Assignee: Milton Roy Company, Petersburg, Fla.

[21] Appl. No.: 656,058

[22] Filed: Sep. 28, 1984

[51] Int. Cl.$^4$ .................... H03M 1/14; H03M 1/10

[52] U.S. Cl. .................. 340/347 AD; 340/347 NT; 340/347 CC

[58] Field of Search ............... 340/347 NT, 347 CC, 340/347 AD

[56] References Cited

U.S. PATENT DOCUMENTS 4,034,364  7/1977  Fukuda et al. ............ 340/347 NT
4,344,067  8/1982  Lee ........................ 340/347 CC Primary Examiner—L. T. Hix
Assistant Examiner—David M. Gray
Attorney, Agent, or Firm—Woodcock Washburn Kurtz Mackiewicz & Norris

[57] ABSTRACT

A method and apparatus for converting an analog input signal to a digital output signal equal to the logarithm of the ratio of the input signal to a reference signal includes a method and apparatus for counting the cycles from a fixed frequency source for the time required for a capacitor to discharge through a resistor from a reference voltage to a calibration voltage; storing the result; counting the cycles from the same fixed frequency source for the time required for the capacitor to discharge through the resistor from the reference signal to the input signal and dividing the result by the stored result.

13 Claims, 7 Drawing Figures

LOGARITHMIC ANALOG TO DIGITAL CONVERTER

This invention relates in general to analog to digital (A/D) converters and more particularly, to a method and apparatus for providing a digital output signal equal to the logarithm of the ratio of an unknown analog input voltage to a fixed reference voltage.

A/D converters are widely employed in a variety of measuring instruments and in a number of other applications. Such converters convert an analog input signal to a digital output signal using a variety of well known techniques. One particular form of A/D converter provides an output signal that is equal to the logarithm of the ratio of the input voltage to a fixed reference voltage. Such logarithmic A/D converters are useful in a number of scientific applications where the measurement of exponentially varying quantities is required.

Logarithmic A/D conversion has heretofore been accomplished through the use of several different techniques including techniques relying upon the exponential relationship between the terminal voltage and current through a semiconductor junction, as well as the exponential characteristics of the voltage on an R-C circuit.

The use of the forward V-I characteristics of semiconductor junctions provides a high degree of precision over many decades of input signals. It is, however, more expensive than certain other techniques and is particularly subject to the temperature dependence of junction diode characteristics.

The component values of R-C circuits can be made less temperature sensitive than semiconductor junctions, but are nevertheless subject to long term changes as well as small but significant temperature sensitive variation.

Prior art logarithmic analog to digital converters of the R-C decay type have relied upon scaling circuits to convert an output that is a function not only of the desired input signal, but also of the component values of the R-C circuit to a value equal to the desired logarithmic. Because such scaling circuits are subject to value changes that do not necessarily track those occurring in the measuring circuit, inaccuracies are introduced into the conversion. It is desirable to provide a logarithmic A/D converter that eliminates such inaccuracies by eliminating the errors introduced in scaling the output.

Accordingly, it is an object of this invention to provide a logarithmic A/D converter that produces a digital output signal equal to the logarithm of the ratio of an unknown analog input signal to a fixed reference voltage.

It is another object of this invention to provide a logarithmic A/D converter that is substantially insensitive to variations in the values of certain of the critical components thereof.

It is still another object of this invention to provide a logarithmic A/D converter that is self-compensating without the need for adjustment by the operator.

Briefly stated, and in accordance with a presently preferred embodiment of this invention, a logarithmic A/D converter includes a voltage reference; a capacitor selectively connected to the voltage reference and a resistor; a comparator having one input connected to the resistor, input switching means selectively connecting a second input of the comparator to a voltage to be measured or first and second calibrating reference sources. A counter is selectively coupled to a fixed frequency oscillator by controllable gate means active during the time required for the capacitor to discharge through the resistor from the reference voltage to the input voltage or calibrating voltage being measured. A control circuit coupled to the switch means selectively connects the capacitor to the voltage reference or the resistor and selects among the unknown voltage and the calibrating voltage. The control circuit also resets the counter to zero at the beginning of each measurement cycle and controls the operation of an arithmetic processor to produce a converted output.

While the aspects of the invention that are regarded as novel are set forth with particularity in the appended claims, the invention itself, together with further objects and advantages thereof, may be more readily understood by reference to the following detailed description taken in connection with the accompanying drawings in which:

Figure 1:
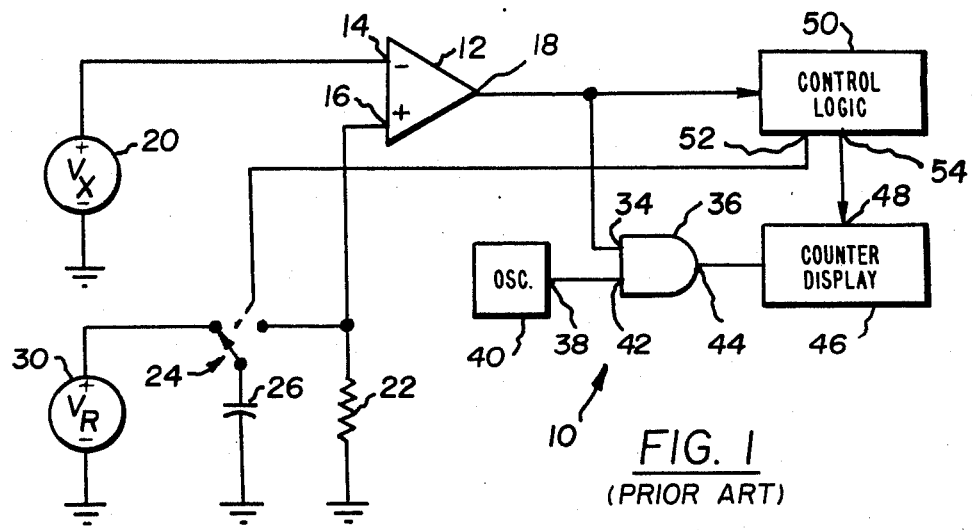
FIG. 1 is a block diagram-schematic of a logarithmic A/D converter in accordance with the prior art.

Referring now to FIG. 1, a logarithmic A/C converter in accordance with the prior art is illustrated generally at 10. The converter 10 includes a comparator 12 having an inverting input 14, a noninverting input 16 and an output 18. Input 14 is connected to a source of voltage $V_X$ to be measured 20. Input 16 is connected through resistor 22 to ground. Input 16 is also selectively connected through switch 24 to capacitor 26 which is adapted to be connected in parallel circuit relationship with resistor 22. Switch 24 is operative to connect capacitor 26 either to resistor 22 or voltage reference 30 having a voltage $V_R$.

The output 18 of comparator 12 is connected to a first input 34 of an AND gate 36. An output 38 of an oscillator 40 is connected to a second input 42 of AND gate 36. An output 44 of AND gate 36 is connected to a counter-display circuit 46 of conventional design. Output 18 of comparator 12 is also connected to a control logic circuit 50. Control logic circuit 50 is operative to provide a control signal at output 52 for selectively energizing switch 24 and a second control signal at output 54 connected to reset input 48 of counter display circuit 46.

Figure 2:
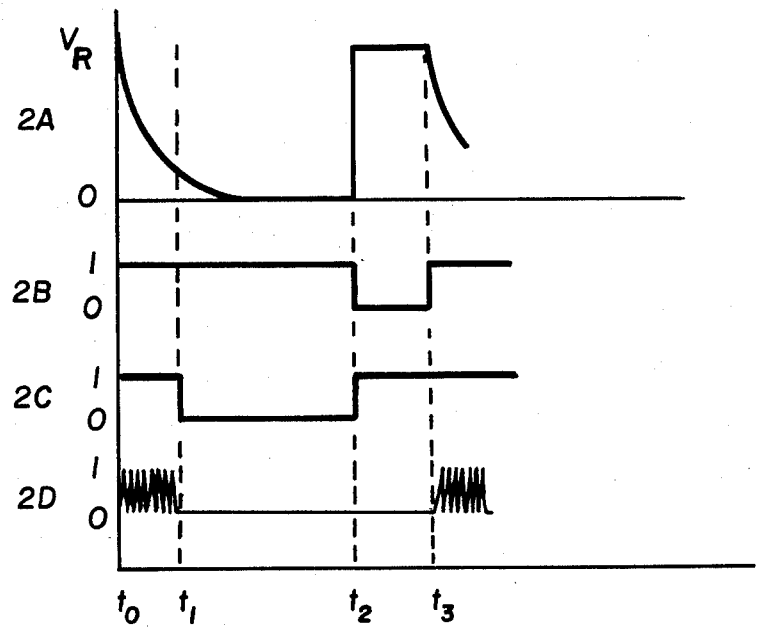
FIG. 2 is a timing diagram for the circuit shown in FIG. 1.

The operation of prior art A/D converter 10 may be more readily appreciated by referring now to FIG. 2 wherein certain of the inputs and outputs to the various elements of A/D converter 10 are illustrated in graphical form. FIG. 2A shows the voltage at input 16 of comparator 12. FIG. 2B shows the position of switch 24, 1 designating resistor 22 and 0 designating reference 30. FIG. 2C shows the output 18 of comparator 12 and FIG. 2D shows the output 44 of AND gate 36.

At time $t_0$, immediately after switch 24 switches capacitor 26 from voltage reference source 30 to resistor 22, the voltage appearing at input 16 begins to decay exponentially from reference voltage $V_R$ to zero. As long as this voltage exceeds the measured voltage $V_X$ applied to inverting input 14 of comparator 12, output 18 of the comparator remains high as shown in FIG. 2C and oscillator pulses are coupled through AND gate 36 to counter-display 46 as shown in FIG. 2D.

The instantaneous voltage across a capacitor having a value C discharging through a resistor having a value R can be expressed by the equation:

$$V_i = V_o e^{-t/RC}$$

Solving for t yields:

$$t = -RC \ln (V_i/V_o)$$

which can be expressed as:

$$t = -RC \ln 10 \log (V_i/V_o)$$

The number of cycles of oscillator 40 occuring during time t may be expressed as:

$$N = ft$$

where f is the frequency of the oscillator. Substituting into the last expression for t yields:

$$N = -fRC \ln 10 \log V_i/V_o$$

Referring to FIG. 2C, it will be seen that when the voltage at input 16 reaches the voltage applied to terminal 14, output 18 of comparator 12 goes low thus disabling AND gate 36 and disconnecting counter-display 46 from oscillator 40. The number of counts accumulated in counter display 46 is directly proportional to the log of $V_X/V_R$.

However, the output is multiplied by a constant proportional to the frequency of oscillator 40, the resistance of resistor 22 and the capacitance of capacitor 26. Each of these values is susceptible to change due to environmental considerations, aging and the like. Additionally, in order to obtain a result that is equal to the log of $V_X/V_R$, the output of the prior art A/D converter must be adjusted for the constant. Such adjustment is ordinarily accomplished by additional circuitry that will itself introduce errors and will be subject to drift that may not track the drift of A/C converter.

Figure 3:
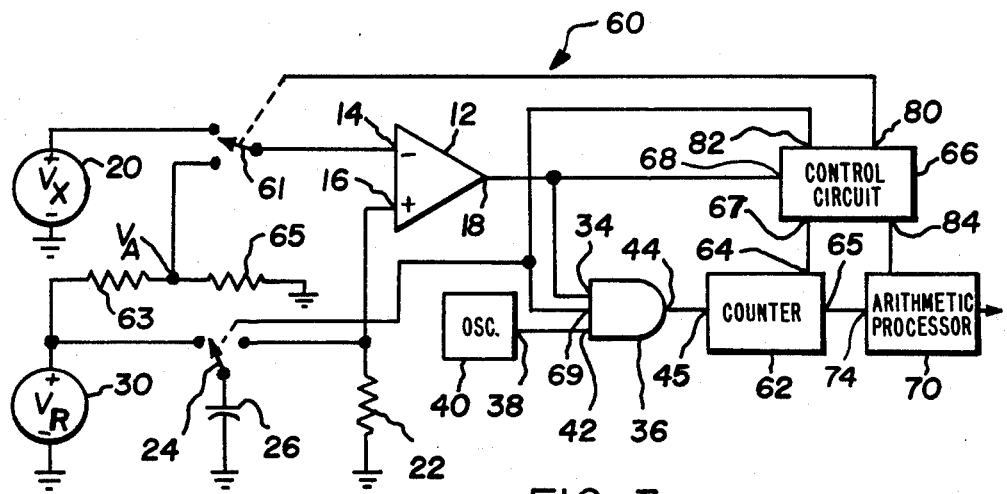
FIG. 3 is a block diagram-schematic of a logarithmic A/D converter in accordance with one embodiment of this invention.

Referring now to FIG. 3, an analog to digital converter 60 in accordance with this invention is illustrated. In this and the other figures, like elements are designated by like reference numerals.

A comparator 12 includes an inverting input 14 selectively connected by switch 61 to input voltage source 20 or to voltage reference source 30 through a voltage divider comprising resistors 63 and 65. Preferably, the value of resistor 63 is selected to be nine times the value of resistor 65 so that the voltage $V_A$ applied to switch 61 is one-tenth of the reference voltage $V_R$.

Switch 61 is preferably a semiconductor switch operative to be controlled by a logic signal. It has been found that CMOS switches such as the CD-4053 and CD-4052 may be employed in accordance with this invention.

The output 18 of comparator 12 is connected to an input 34 of a three input AND gate 36. Another input 42 is connected to an output 38 of a fixed frequency oscillator 40. Output 44 of AND gate 36 is connected to an input 45 of a digital counter 62 having a reset input 64.

An output 65 of counter 62 provides a digital signal equal to the number of cycles of oscillator 40 applied to input 45 of counter 62 between each reset signal and the change in state of output 18 of comparator 12. Output 65 of counter 62 is connected to an input 74 of an arithmetic processing circuit 70, the function of which will be more completely described hereinbelow.

A control circuit 66 is responsive to output 18 of comparator 12 applied to input 68 of control circuit 66 to produce a reset signal at output 67, first and second control signals at outputs 82 and 80 for controlling AND gate 36 and switches 24 and 61 and a state control signal at output 84 applied to input 72 of arithmetic processor 70.

Figure 4:
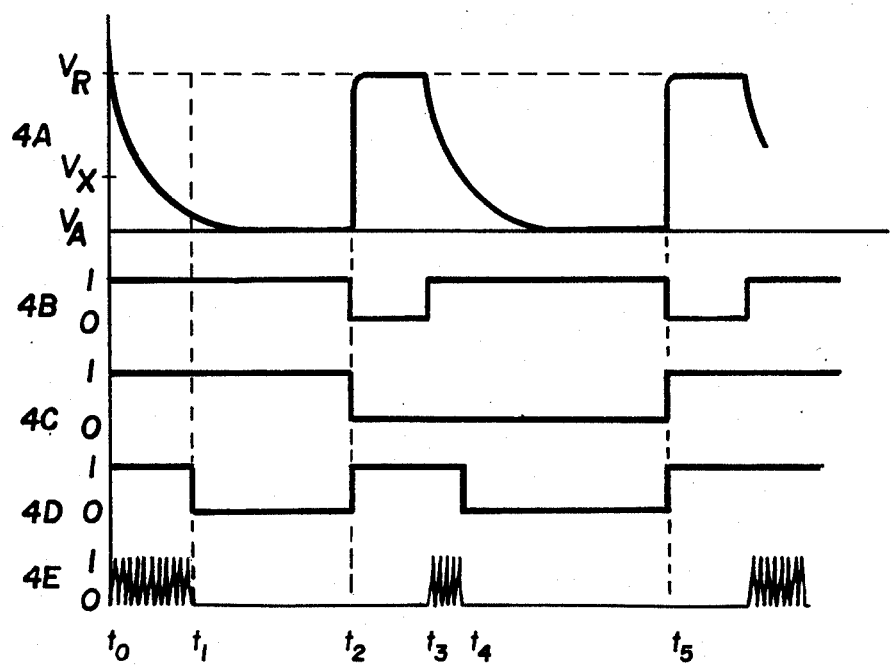
FIG. 4 is a timing diagram of the converter of FIG. 3.

The operation of A/D converter 60 may be readily understood by referring now to FIG. 4. The voltage at noninverting input 16 of comparator 12 is represented at FIG. 4A. Outputs 80 and 82 of control circuit 66 are shown at FIGS. 4C and 4B, respectively. The output 18 of comparator 12 is shown at FIG. 4D. The input 45 to counter 62 is shown at FIG. 4E. For convenience, the times at which various signals occur are designated $t_0$ through $t_5$.

Initially, switch 24 is set to connect capacitor 26 to voltage reference 30 and capacitor 26 is precharged to the reference voltage. It will be understood by those skilled in the art that a small resistance may be inserted between voltage reference 30 and switch 24 to limit the current drawn from voltage reference 30 while capacitor 26 is charged. At time $t_0$, outputs 82 and 80 are high as shown in FIGS. 4B and 4C, thus control circuit 66 sets switch 24 to connect capacitor 26 to resistor 22 while switch 61 is set to connect input 14 to the junction of resistors 63 and 65. A third input 69 of AND gate 36 is connected to output 82 of control circuit 66 and is set high at time $t_0$ simultaneously with switch 24 being energized to connect capacitor 26 to resistor 22. At this instant, as can be seen in FIG. 4E, counter 62 begins to count pulses from oscillator 40. The output 18 of comparator 12 remains high while capacitor 26 discharges through resistor 22 until the voltage at terminal 16 equals the voltage at terminal 14 at which time, $t_1$, output 18 of comparator 12, goes low disabling AND gate 36 and disconnecting oscillator 40 from counter 62. The number of cycles of oscillator 40 counted by counter 62 may be expressed as:

$$N_A = (-fRC \ln 10)(\log V_A/V_R)$$

The number of counts is stored by arithmetic processing unit 70 for later use as will be hereinbelow described.

At time $t_2$, as shown in FIGS. 4C and 4D, outputs 82 and 80 go low, switch 24 is set to connect capacitor 26 to voltage reference source 30, the capacitor is recharged to the reference voltage and counter 62 is reset to zero switch 61 is also set to connect the input voltage source 20 to the inverting input 14 of comparator 20.

At time $t_3$, switch 24 is set to connect capacitor 26 to resistor 22 and the discharge cycle begins. Output 18 of comparator 12 remains high until the voltage applied to input 16 decays to the unknown voltage applied to terminal 14. At time $t_3$, output 82 goes high, and because output 18 of comparator 12 is already high, AND gate 36 is energized to connect oscillator 40 to counter 62, switch 24 is energized to connect capacitor 26 to resistor 22 and counts are accumulated. At time $t_4$, output 18 of comparator 12 goes low, input 34 of AND gate 36 goes low and oscillator 40 is disconnected from counter 62. The accumulated count is supplied to arithmetic processor 70. The count may be expressed as:

$$N_X = (-fRC \ln 10)(\log V_X/V_R)$$

Arithmetic processor 70 divides the count corresponding to the unknown voltage by the previously stored count corresponding to the scaling voltage as follows:

$$\frac{N_X}{N_A} = \frac{(-fRC \ln 10)(\log V_X/V_R)}{(-fRC \ln 10)(\log V_A/V_R)}$$

which may be simplified to:

$$\frac{N_X}{N_A} = \frac{\log V_X/V_R}{\log V_A/V_R}$$

If the ratio of resistors 63 and 65 is selected so that the voltage $V_A$ appearing at their junction is one-tenth the reference voltage, then $\log V_A/V_R = -1$ and $$N_X/N_A = -\log V_X/V_R$$

It will be appreciated that a logarithmic A/D converter in accordance with the embodiment of this invention shown at FIG. 3, provides an output that is substantially independent of the values of resistor 22, capacitor 26 and the frequency of oscillator 40.

No particular structure is shown for arithmetic processor 70. Those skilled in the art will recognize that arithmetic processor 70 may be implemented in a wide variety of ways including, for example, a microprocessor adapted to store the count corresponding to the measured voltage in one register, store the count corresponding to the scaling voltage in a second register, and perform a division. The particular method by which the storage and division functions are implemented do not per se form a part of this invention.

Figure 5:
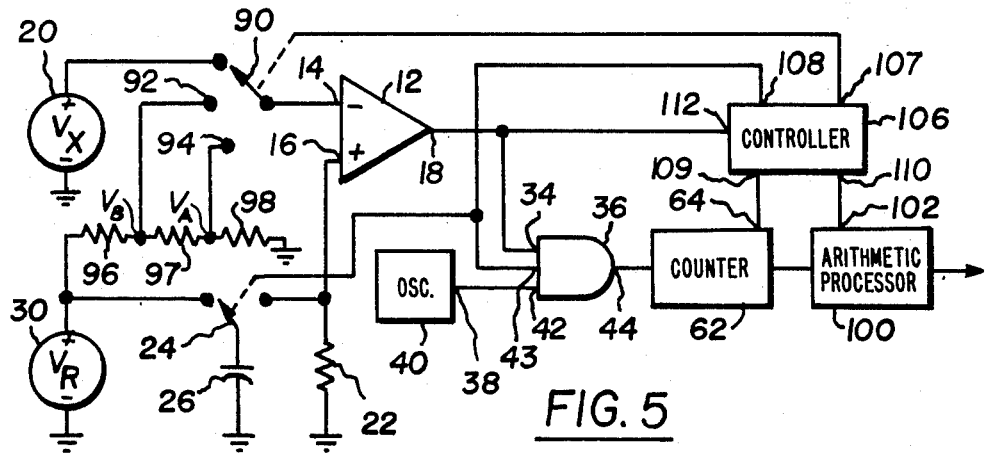
FIG. 5 is a block diagram-schematic of a three-step logarithmic A/D converter in accordance with another embodiment of this invention.

Referring now to FIG. 5, an alternative embodiment of this invention is illustrated. The embodiment shown in FIG. 5 uses two calibrating voltages in a manner as will be more fully described below. Referring now to FIG. 5, comparator 12 has an inverting input 14 selectively connected through switch 90 to unknown voltage source 20, first calibrating voltage 92 or second calibrating voltage 94. The calibrating voltages are produced by a series voltage divider including resistors 96, 97 and 98 connected between voltage reference 30 and ground. For convenience, the voltage produced at the junction of resistors 96 and 97 will be referred to herein as $V_B$ and voltage produced at the junction of resistors 97 and 98 shall be referred to as $V_A$. The voltage to be measured is referred to as $V_X$ and reference voltage is referred to as $V_R$.

Resistors 96, 97 and 98 are preferably selected so that $V_B/V_A$ equals 10.

Figure 6:
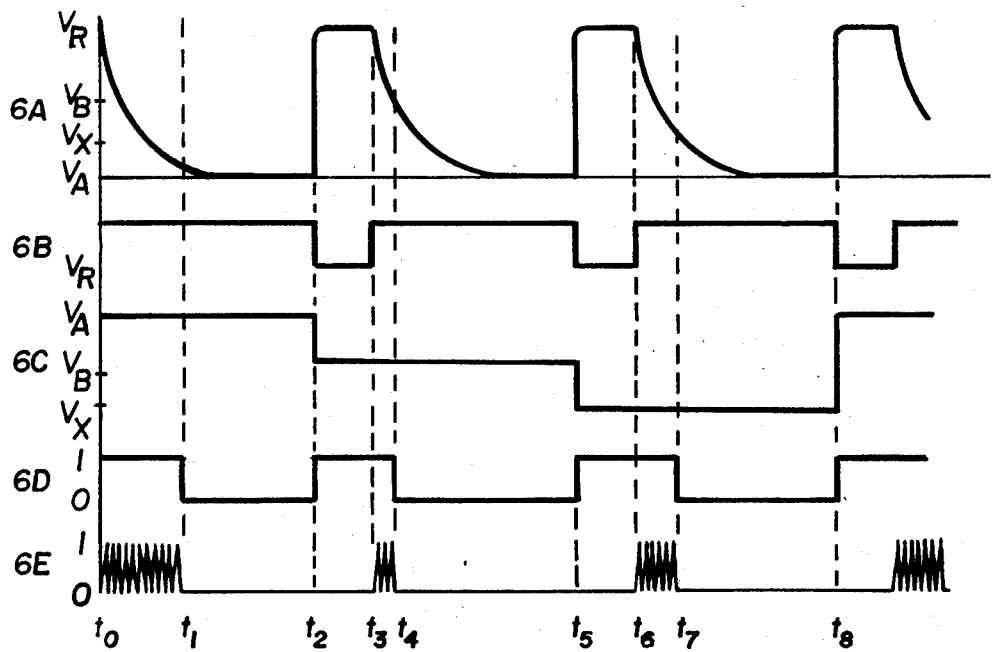
FIG. 6 is a timing diagram of the converter of FIG. 5.

The operation of the logarithmic A/D converter shown in FIG. 5 may be more readily understood by referring now to FIG. 6 which illustrates the various waveforms and control signals in graphical form. FIG. 6A shows the voltage at input 16 of comparator 12. FIG. 6B shows output 108 of controller 106, FIG. 6C shows output 107 of controller 106. FIG. 6D shows the output 18 of comparator 12 and FIG. 6E shows the output 44 of AND GATE 36.

Initially, prior to $t_0$, capacitor 26 is charged to $V_R$. At time $t_0$, switch 24 is set by control circuit 106 to connect capacitor 26 to resistor 22. The voltage applied to non-inverting input 16 of comparator 12 begins to decay from $V_R$ to zero. Inverting input 14 of comparator 12 is connected to junction 94 of resistors 97 and 98 and voltage $V_A$ is applied to the comparator. Output 18 of comparator 12 remains high and oscillator 40 is coupled to counter 62 until the voltage on capacitor 26 decays to $V_A$ at which time output 18 of comparator 12 goes low and oscillator 40 is disconnected from counter 62.

The number of cycles of oscillator 40 applied to counter 62 during the time required for capacitor 26 to discharge from $V_R$ to $V_A$ may be expressed as:

$$N_A = (-fRC \ln 10)(\log V_A/V_R)$$

$N_A$ is stored by arithmetic processor 100.

At time $t_2$, control circuit 106 resets switch 24 to reference 30 to precharge capacitor 26; sets switch 90 to measure $V_B$ and resets counter 62 to zero. At time $t_3$, which is selected to give capacitor 26 adequate time to charge fully, control circuit 106 sets switch 24 to connect capacitor 26 to resistor 22 and simultaneously applies an enabling signal to input 43 of AND gate 36, thereby connecting oscillator 40 to counter 62. Counts are accumulated until the voltage applied to input 16 of comparator 12 equals the voltage applied to input 14 whereupon output 18 goes low and AND gate 36 is disabled. Arithmetic processor 100 subtracts $N_B$ from $N_A$. The result may be expressed as follows:

$$N_A - N_B = (-fRC \ln 10)(\log V_A/V_R - \log V_B/V_R)$$

This may be simplified to:

$$N_A - N_B = (-fRC \ln 10)(\log V_A/V_B)$$

This value is stored by arithmetic processor 100 for later use.

At time $t_5$, a third measurement cycle commences. The cycle proceeds as in the case of the measurement $V_A$ and $V_B$ except that $V_X$ is measured. At time $t_7$, the value $N_X$, which may be expressed as:

$$N_X = (-fRC \ln 10)(\log V_X/V_R)$$

is divided by the difference between $N_A$ and $N_B$. The result may be expressed as follows:

$$\frac{N_X}{N_A - N_B} = \frac{(-fRC \ln 10)(\log V_X/V_R)}{(-fRC \ln 10)(\log V_A/V_B)}$$

This may be simplified to:

$$\frac{N_X}{N_A - N_B} = \frac{\log V_X/V_B}{\log V_A/V_B}$$

If $V_A/V_B$ equals 1/10, then $\log V_A/V_B$ equals $-1$. Substituting yields:

$$\frac{N_X}{N_A - N_B} = \frac{\log V_X/V_R}{-1} = -\log V_X/V_R$$

It will be seen that the result is dependent solely on $V_X$ and $V_R$, the dependency on the values of capacitor 26, resistor 22 and the frequency of oscillator 40 having been eliminated.

While it is preferred that $N_A/N_B$ be selected to equal 1/10, the invention is not so limited. Other ratios may be selected to provide scaled outputs independent of frequency resistance and capacitance.

The embodiment of this invention shown in FIG. 5 has an additional advantage over the embodiment shown in FIG. 3 in that errors in the count due to delays in the circuit are at least in part eliminated. Assume, for example, that constant error of X counts is introduced during each measurement. Since the final result includes the difference of $N_A$ and $N_B$, the error is canceled and the accuracy of $N_A - N_B$ will be dependent solely on the ratio of $V_A$ to $V_B$.

Figure 7:
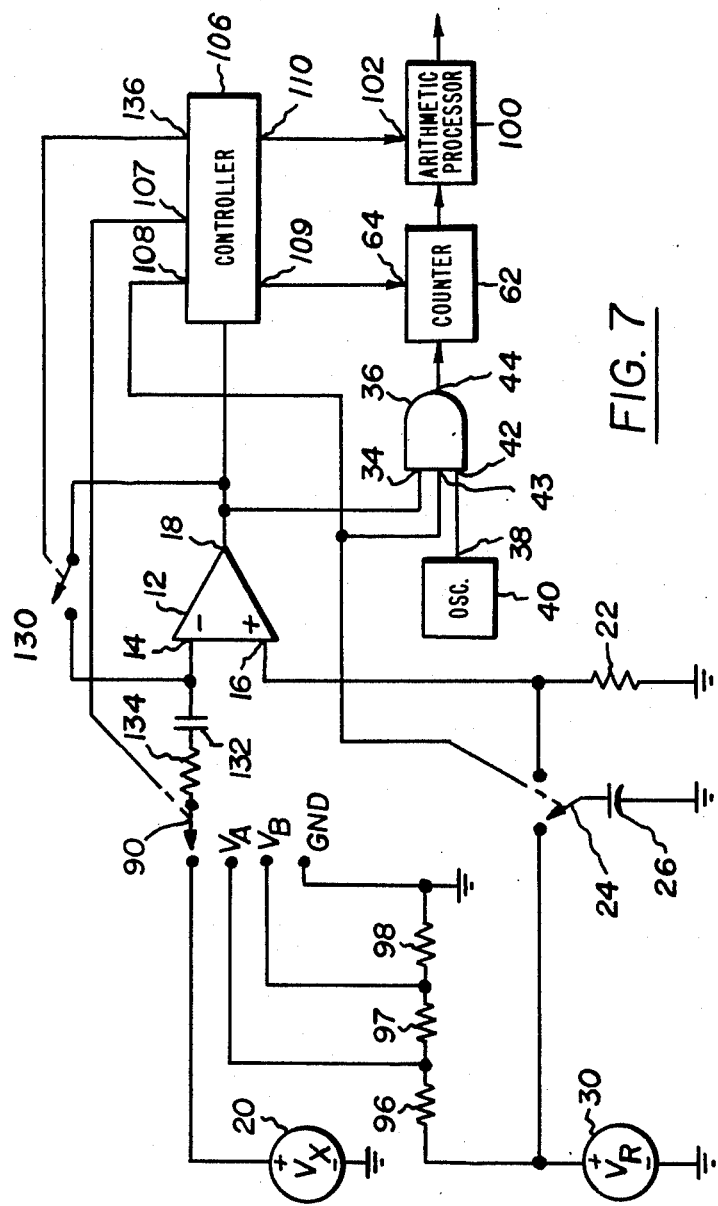
FIG. 7 is a block diagram-schematic of the logarithmic A/D converter of FIG. 5 having an offset voltage compensation feature.

FIG. 7 shows a schematic block diagram of still another embodiment of this invention similar to that shown in FIG. 5, but including means for eliminating the effect of the offset voltage of comparator 12. It will be noted that the circuit of FIG. 7 is substantially identical to the circuit of FIG. 5, except that an additional switch 130, a capacitor 132 and a resistor 134 have been added. Further, an additional position has been added to switch 90 and a control line 136 from control circuit 106 has been added to control switch 130.

Switch 130 is open at all times during the measurement cycle except for a brief period during the time that switch 24 connects capacitor 26 to voltage reference 30. During this interval, switch 130 is closed and switch 90 connects resistor 134 to ground. Comparator 12 is configured as a unity gain operational amplifier. Such an amplifier maintains its inputs at an equal voltage. Because noninverting input 16 is connected to ground, capacitor 132 will charge to a voltage equal to the offset voltage of the amplifier. A resistor 134 is included to prevent oscillation of comparator 12. Since no current flows in the amplifier input circuit, resistor 134 does not substantially affect the accuracy of the circuit.

During each measurement cycle, the voltage appearing across capacitor 132 is equal, but opposite in polarity to the offset voltage of the amplifier thereby cancelling the offset and eliminating source of error.

It will be appreciated that because essentially no current flows into the inverting input 14 of comparator 12, the voltage on capacitor 132 will be maintained during the measurement portion of the cycle.

While the apparatus in accordance with this invention has been described in connection with certain presently preferred embodiments thereof, it will be appreciated that the method of the invention may be practiced in other ways that will be apparent to those of ordinary skill in the art.

In its most fundamental terms, the method of this invention for converting an analog input signal to a digital output signal equal to the logarithm of the ratio of the input signal to a reference signal comprises the steps of counting the cycles from a fixed frequency source for the time required to discharge a capacitor through a resistor from the reference signal level to a calibration signal level; storing the result; counting the cycles from the fixed frequency source for the time it takes to discharge the capacitor through the resistor from the reference signal to an unknown input signal; and dividing the result by the stored result.

In accordance with the embodiment of the invention exemplified by the apparatus shown in FIG. 5, the method comprises counting the cycles from a fixed frequency source for the time it takes to discharge a capacitor through a resistor from a reference signal to a first and then to a second calibration signal; storing both results; subtracting the results and storing the result and then counting the cycles from the fixed frequency source from the time it takes to discharge the capacitor through the resistor from the reference signal to the input signal and dividing the result by the result of the subtraction.

While the invention has been described in connection with certain presently preferred embodiments thereof, those skilled in the art will recognize that certain modifications and changes may be made therein without departing from the true spirit and scope of the invention which is intended to be defined solely by the appended claims. For example, a number of the functions of the invention illustrated in the several figures may be accomplished by an appropriately programmed computer, such as a microcomputer. Specifically, substantially all of the control logic, the counter, the arithmetic processing, the AND gate and the oscillator may be provided by an appropriately configured microcomputer as will be apparent to one skilled in the art. The several intermediate values generated by the converter during processing may be readily stored in the registers of such a microcomputer.

While the calibration signals, $V_A$ in accordance with FIG. 3 or $V_A$ and $V_B$ in accordance with FIGS. 5 and 7 are shown as being measured prior to each measurement of the unknown input voltage, it will be understood that where more frequent measurement of input voltage is required, the calibrating voltages may be measured less often than described. Specifically, it may be desirable in accordance with this invention to measure the calibrating voltages and store the result and thereafter make successive measurements of the input voltage using the previously stored calibrating voltage to produce the desired output. Thereupon, the calibrating voltage may be remeasured and the stored value updated as conditions require, taking into account the stability of the circuit components.

I claim:

1. A method for converting an analog input signal to a digital output signal equal to the logarithm of the ratio of said input signal to a reference signal comprising the steps of:
    counting the cycles from a fixed frequency source for the time it takes to discharge a capacitor through a resistor from the reference signal to a calibration signal;
    storing the result;
    counting the cycles from said fixed frequency source for the time it takes to discharge said capacitor through said resistor from the reference signal to said input signal;
    dividing the result by said stored result.

2. The method of claim 1 further comprising the step of setting said calibration signal equal to 0.1 times said reference signal.

3. A method for converting an analog input signal to a digital output signal equal to the logarithm of the ratio of said input signal to a reference signal comprising the steps of:
    counting the cycles from a fixed frequency source for the time it takes to dischrge a capacitor through a resistor from the reference signal to a first calibration signal;
    storing the result;

counting the cycles from a fixed frequency source for the time it takes to discharge a capacitor through a resistor from the reference signal to a second calibration signal;

subtracting the second calibration signal from the stored result and replacing said stored result with the difference;

counting the cycles from said fixed frequency source for the time it takes to discharge said capacitor through said resistor from the reference signal to said input signal;

dividing the result by said stored difference.

4. The method of claim 3 wherein said first calibration signal and said second calibration signal are related by the ratio 10:1.

5. Apparatus for converting an analog input signal to a digital output signal equal to the logarithm of the ratio of said input signal to a reference signal comprising:

means for counting the cycles from a fixed frequency source for the time it takes to discharge a capacitor through a resistor from the reference signal to a calibration signal;

means for storing the result;

means for counting the cycles from a fixed frequency source for the time it takes to discharge said capacitor through said resistor from the reference signal to the input signal; and means for dividing the result by the stored result.

6. A logarthmic analog to digital converter for producing a digital output signal equal to the logarithm of the ratio of an input signal to a reference voltage comprising:

a voltage comparator having first and second inputs and an output;

a voltage reference source;

a calibrating voltage source;

first switch means connected to said first input operative to selectively connect said first input to said input signal or said calibrating voltage source;

a capacitor;

a resistor connected to said second input;

second switch means operative to selectively connect said capacitor to said voltage reference source to charge said capacitor or to said resistor to discharge said capacitor;

fixed frequency oscillator means for producing output pulses;

counter means responsive to said oscillator means to provide a digital output equal to total the number of pulses applied to said counter means;

gate means coupled between said oscillator means and said counter, said gate means connected to the output of said voltage comparator;

control means connected to said first and second switches for sequentially connecting said capacitor to said voltage reference source during a charging period and to said resistor during a discharge period said control means connected to said counter to reset said counter prior to the beginning of said second measurement period; said control means operative to sequentially connect said first input to said input signal during a measurement period and to said calibrating voltage source during a calibration period;

digital storage means connected to said counter means for storing the digital output produced by said counter during said calibration period;

arithmetic processing means connected to said counter and said storage means for dividing the output produced by said counter during said measurement period by the output stored during said calibration period.

7. The apparatus of claim 6 wherein said calibrating voltage source comprises a resistive voltage divider connected to said voltage reference source.

8. The apparatus of claim 7 wherein said calibrating voltage source is adapted to provide a calibrating voltage equal to 0.1 times said voltage reference source.

9. The apparatus of claim 6 further comprising means for sensing the offset voltage of said comparator during said discharge period and subtracting said offset voltage from said input signal during said measurement period and from said calibrating voltage during said calibration period.

10. In a logarithmic analog to digital converter of the type including means for charging a capacitor to a reference voltage; means for exponentially discharging said capacitor through a resistor; means for continuously comparing one of a plurality of input signals including an analog input signal and at least one calibration input signal to the instantaneous voltage on said capacitor; oscillator means and counter means for producing a count equal to the number of cycles of said oscillator during the time required for the voltage on said capacitor to decay from said reference voltage to the value of said input signal, said number of cycles being a function of the logarithm of the ratio of said reference voltage to said input signal multiplied by a constant determined by the value of said capacitor, the value of said resistor and the frequency of said oscillator, the improvement comprising:

means for sequentially determining the counts for said analog input signal and said at least one calibration input signal; means for dividing the count for said analog input signal by the count for said at least one calibration input signal, the result being a function of the logarithm of the ratio of said analog input signal to reference voltage, and independent of the values of said capacitor, said resistor and the frequency of said oscillator.

11. The converter of claim 10 wherein said at least one calibration input signal equals 0.1 times said reference voltage.

12. Apparatus for producing a digital output signal equal to the logarithm of the ratio of an analog signal to a reference signal comprising:

converter means responsive to an input signal and said reference signal for providing an intermediate digital output signal equal to a constant multiplied by the logarithm of the ratio of said input signal to said reference signal;

means for producing a calibration signal;

means for sequentially connecting said converter means to said analog signal and said calibration signal;

storage means for storing the intermediate digital output signals corresponding to said analog signal and said calibration signal;

dividing means for dividing said intermediate digital output signals to produce said digital output signal that is a function only of said logarithm of the ratio of said analog signal to said reference signal.

13. The apparatus of claim 12 wherein said calibration signal equals 0.1 times said reference signal.

* * * * *